United States Patent
Castillo Buenaventura et al.

(10) Patent No.: US 12,165,820 B2
(45) Date of Patent: Dec. 10, 2024

(54) ELECTRICAL CONTACTLESS SWITCH

(71) Applicant: Schneider Electric Industries SAS, Rueil Malmaison (FR)

(72) Inventors: Felipe Castillo Buenaventura, Angoulême (FR); Indira Prakasam, Singapore (SG)

(73) Assignee: Schneider Electric Industries SAS, Rueil Malmaison (FR)

( * ) Notice: Subject to any disclaimer, the term of this patent is extended or adjusted under 35 U.S.C. 154(b) by 86 days.

(21) Appl. No.: 17/873,217

(22) Filed: Jul. 26, 2022

(65) Prior Publication Data

US 2023/0045318 A1    Feb. 9, 2023

(30) Foreign Application Priority Data

Aug. 4, 2021   (EP) ..................... 21306088

(51) Int. Cl.
*H01H 50/18*   (2006.01)
*H01H 50/02*   (2006.01)
*H01H 50/64*   (2006.01)

(52) U.S. Cl.
CPC ............ *H01H 50/18* (2013.01); *H01H 50/02* (2013.01); *H01H 50/641* (2013.01); *H01H 2235/01* (2013.01)

(58) Field of Classification Search
CPC ...... H01H 50/18; H01H 50/02; H01H 50/641; H01H 2235/01; H01H 36/004; H01H 13/10; H01H 13/20; H01F 1/047; H03K 17/97

(Continued)

(56) References Cited

U.S. PATENT DOCUMENTS

| | | | | |
|---|---|---|---|---|
| 4,755,645 A | * | 7/1988 | Naoki ................... | H01H 13/20 200/290 |
| 4,985,605 A | * | 1/1991 | Valenzona ........... | H01H 13/585 200/341 |

(Continued)

FOREIGN PATENT DOCUMENTS

| | | |
|---|---|---|
| EP | 0797302 A1 | 9/1997 |
| GB | 1316787 A | 5/1973 |

OTHER PUBLICATIONS

European Search Report and Search Opinion dated Jan. 25, 2022 for corresponding European Patent Application No. 21306088.2, 9 pages.

*Primary Examiner* — Shawki S Ismail
*Assistant Examiner* — Lisa N Homza
(74) *Attorney, Agent, or Firm* — Locke Lord LLP

(57) ABSTRACT

An electrical contactless switch that includes a housing, a moveable element and a magnetic field sensor. The moveable element is made of a ferromagnetic material and is slidably mounted in the housing. The moveable element is adapted to move relative to the housing between a resting position and an engaged position, the moveable element is elastically biased towards the resting position. The moveable element includes a plurality of magnetized legs spaced from each other and at least part of the magnetized legs is slidably guided in the housing. The magnetic field sensor is secured to the housing and positioned to face the plurality of magnetized legs. The magnetic sensor is configured to detect a magnetic field generated by the magnetized legs as the moveable element is in the engaged position. The moveable element is closer to the magnetic field sensor in the engaged position than in the resting position.

17 Claims, 3 Drawing Sheets

(58) Field of Classification Search
USPC .......................................................... 335/202
See application file for complete search history.

(56) References Cited

U.S. PATENT DOCUMENTS

| | | | | |
|---|---|---|---|---|
| 5,038,124 | A * | 8/1991 | Streich | H01H 50/305 335/277 |
| 5,198,789 | A * | 3/1993 | Taylor | H01H 50/541 335/205 |
| 5,380,970 | A * | 1/1995 | Mizuno | H01H 13/562 200/523 |
| 5,907,267 | A * | 5/1999 | Reid | H01H 50/08 340/638 |
| 7,538,282 | B2 * | 5/2009 | Tomaki | G03B 9/08 345/161 |
| 2009/0160433 | A1 * | 6/2009 | Oberhoffner | G01D 5/145 324/207.13 |
| 2015/0077203 | A1 * | 3/2015 | Henderson | H01H 36/00 335/207 |
| 2015/0091679 | A1 * | 4/2015 | Bachmann | H03K 17/9517 335/205 |
| 2017/0092447 | A1 * | 3/2017 | Freer | H03K 17/97 |
| 2017/0276749 | A1 | 9/2017 | Hugon et al. | |
| 2019/0304649 | A1 * | 10/2019 | Freer | H05K 5/0217 |
| 2023/0123719 | A1 * | 4/2023 | Taniguchi | H01H 13/14 200/341 |
| 2023/0162929 | A1 * | 5/2023 | Taylor | H01H 13/14 200/341 |

* cited by examiner

ELECTRICAL CONTACTLESS SWITCH

The present disclosure generally relates to a magnetic based contactless switching device suitable for push buttons and selectors.

BACKGROUND

This section provides background information related to the present disclosure which is not necessarily prior art.

Conventionally, switching devices utilize a mechanically controlled contacts that wear out after a given number of operations and limit a longevity of the switching devices. Further-more, such switching devices are not suitable for an operation in a humid environment because the mechanically controlled contacts would be exposed to the entry of humidity and degrade prematurely.

With a progress of technology, the mechanical controlled contacts of the switching devices have been gradually replaced by contactless solid-state switches controlled by a magnetic or an electrical field. In some cases, such contactless solid-state switches utilize a permanent magnet to provide a source of a magnetic field for switching control. A utilization of traditional permanent magnets as a source of a magnetic field in mid to high volume production of switching devices bears manufacturing disadvantages caused by challenges in handling and assembly of permanent magnets that drives overall product cost.

Therefore, it would be advantageous to have a simple, low-cost contactless switching device that is easy to manufacture.

SUMMARY OF THE INVENTION

One aspect of the present disclosure is directed to an electrical contactless switch. The electrical contactless switch comprises a housing, a magnetic field sensor and a moveable element. The moveable element is made of a ferromagnetic material and slidably mounted in the housing. The moveable element is adapted to move relative to the housing between a resting position and an engaged position. The moveable element is elastically biased towards the resting position. The moveable element comprises a plurality of magnetized legs spaced from each other and at least part of the magnetized legs is slidably guided in the housing.

The magnetic field sensor is secured to the housing and positioned to face the plurality of magnetized legs. The magnetic element is configured to detect a magnetic field generated by the magnetized legs as the moveable element is in the engaged position. The moveable element is closer to the magnetic field sensor in the engaged position than in the resting position.

Additionally, the legs of the plurality of magnetized legs may protrude in parallel from one side of the moveable element.

Additionally, the plurality of magnetized legs may be magnetized such that at least one leg of the plurality of magnetized legs is magnetized in an opposite direction than the rest of the plurality of magnetized legs.

Additionally, the plurality of magnetized legs may comprise two side legs and a middle leg between the two side legs, wherein the middle leg is magnetized in an opposite direction than the two side legs.

Additionally, each of the two side legs may be terminated by a hook protruding laterally outwards.

Additionally, the housing may comprise a slot in which the moveable element may be slidably guided and the side legs may be snap-fitted in the slot and maintained in the slot by the hooks cooperating with an abutment belonging to the slot.

Additionally, the switch may further comprise a resilient element positioned at least partially between the plurality of magnetized legs and the magnetic field sensor, wherein the resilient element may be configured to elastically bias the moveable element towards the resting position and counteract a movement of the moveable element from the resting position to the engaged position.

Additionally, the resilient element may be a compression type coil spring.

Additionally, the moveable element may be made of an annealed semi-hard ferromagnetic metal or hard ferromagnetic metal.

Additionally, the annealed ferromagnetic metal may be a cobalt based metal.

Additionally, the moveable element may have a plate shape with a thickness of 1 mm to 3 mm.

Additionally, the magnetic field sensor may comprise a Hall-effect or a magneto-resistive sensor.

A further aspect is directed to a method of manufacturing a moveable element for the electrical contactless switch and/or its alternatives as defined above. The method comprising: providing a moveable element made of a ferromagnetic material and comprising a plurality of legs spaced from each other, and magnetizing the legs by abutting a magnet against one of the legs.

Additionally, the plurality of magnetized legs may comprise two side legs and a middle leg between the two side legs and magnetizing the legs may be performed by abutting the magnet against the middle leg only.

Additionally, the magnet may be a permanent magnet and the moveable element may be made of an annealed semi-hard ferromagnetic metal or hard ferromagnetic metal.

Further areas of applicability will become apparent from the description herein. The description and specific examples in the summary are intended for purposes of illustration only and are not intended to limit the scope of the present disclosure.

BRIEF DESCRIPTION OF THE DRAWINGS

Other features and advantages of the invention appear from the following detailed description of some of its embodiments, given by way of non-limiting example, and with reference to the accompanying drawings, in which.

DETAILED DESCRIPTION

Figure 1:
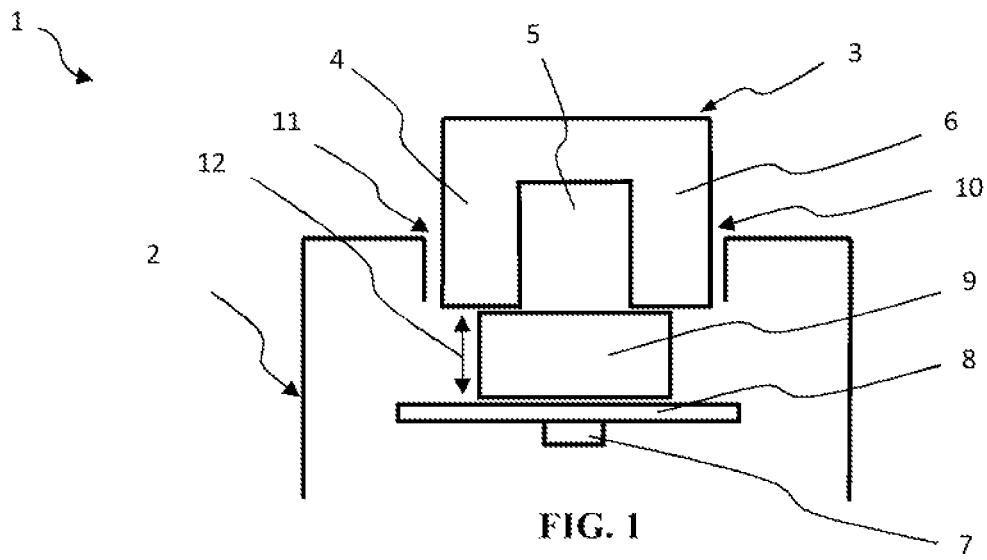
FIG. 1 is an illustration depicting a first embodiment of an electrical contactless switch.

The foregoing summary, as well as the following detailed description of certain examples will be better understood when read in conjunction with the appended drawings. As used herein, an element or step recited in the singular and proceeded with the word "a" or "an" should be understood as not excluding plural of the elements or steps, unless such exclusion is explicitly stated. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

In the figures, the same references denote identical or similar elements, unless stated oth-erwise. In the drawings, the size of each element or a specific portion constituting the element is exaggerated, omitted, or schematically shown for convenience and clarity of description. Thus, the size of each component may not entirely reflect the actual size. In the case where it is judged that the detailed description of the related known functions or constructions may unnecessarily obscure the gist of the present disclosure, such explanation will be omitted.

In FIG. 1 is depicted a first embodiment of an electrical contactless switch 1. The first embodiment comprises a housing 2, a moveable element 3 and a magnetic field sensor 7. The moveable element may move relative to the housing between a resting position and an engaged position as depicted by an arrow 12. The moveable element may slidably move in a slot 11, 10 within the housing 2. The moveable element 3 may have a plurality of magnetized protrusions that may form a plurality of magnetized legs 4 and 6 spaced from each other by having a gap 5 therebetween. Whilst there are two legs of the plurality of magnetized legs depicted in FIG. 1, the moveable element 3 may have three or more legs. The magnetized legs 4 and 6 may protrude in parallel from one side of the moveable element 3. The magnetic field sensor 7 may be secured to the housing and positioned to face the plurality of magnetized legs 4 and 6. The magnetic field sensor 7 may be coupled to a printed circuit board 8 that may be attached (not shown) to the housing 2. The magnetic field sensor 7 detects a magnetic field generated by the plurality of magnetized legs 4, 6 as the moveable element 3 is in the engaged position. The moveable element 3 is closer to the magnetic field sensor 7 in the engaged position than in the resting position. The magnetic field sensor 14 may comprise a Hall-effect or a magneto resistive sensor. The magnetic field sensor 14 may be a Hall-effect switch. The moveable element is elastically biased towards the resting position via a resilient element 9 that may be positioned at least partially between the plurality of magnetized legs 4 and 6 and the magnetic field sensor 7. The resilient element 9 may counteract a movement of the moveable element from the resting position to the engaged position. The resilient element 9 may be made of an elastomer and have variety of shapes.

Figure 2:
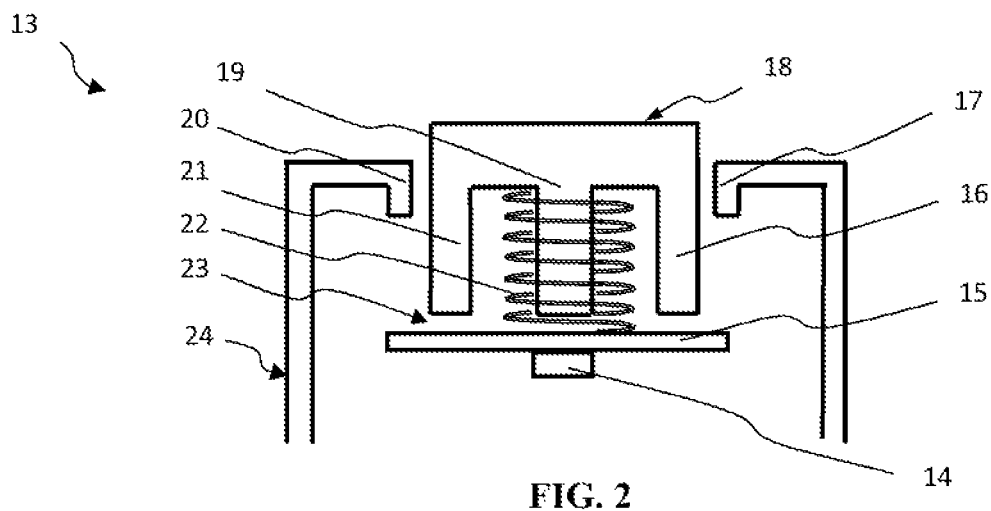
FIG. 2 is an illustration depicting a second embodiment of the electrical contactless switch in the engaged position.
Figure 3:
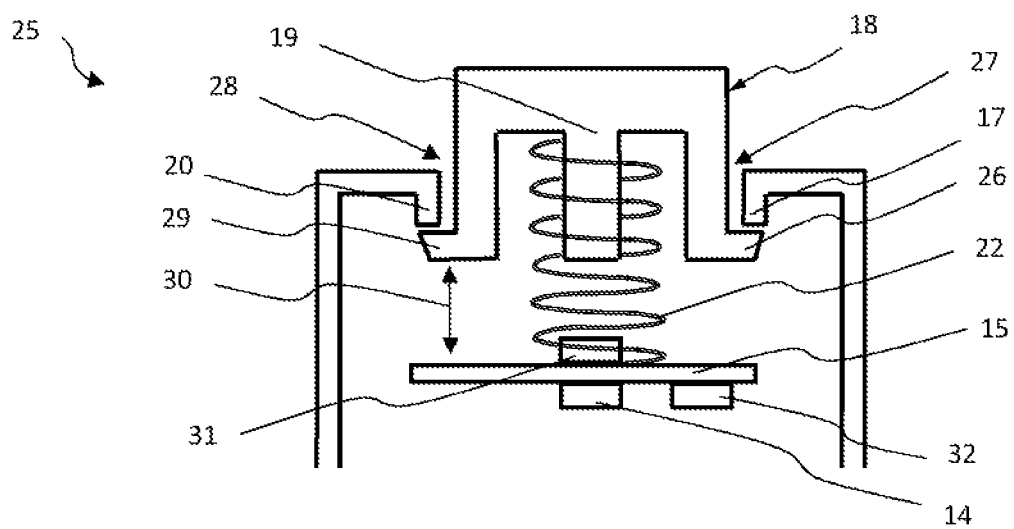
FIG. 3 is an illustration depicting the second embodiment of the electrical contactless switch in the resting position.

FIGS. 2 and 3 depict a second embodiment of the electrical contactless switch 13, 25. FIG. 2 depicts the second embodiment of the electrical contactless switch 13 in an engaged position and FIG. 3 depicts the second embodiment of the electrical contactless switch 13 in a resting position. The second embodiment comprises a housing 24, a moveable element 18 and a magnetic field sensor 14. The moveable element may move relative to the housing between a resting position and an engaged position as depicted by an arrow 30. The moveable element 18 may have a plurality of magnetized protrusions that may form plurality of magnetized legs 16, 19 and 21 spaced from each other by having a gap therebetween. The moveable element 18 as depicted in FIGS. 2 and 3 has three legs, however, the moveable element may have other number of legs than three. The magnetized legs 16, 19 and 21 may protrude in parallel from one side of the moveable element 18. The moveable element 18 may have two side legs 16, 21 and a middle leg 19 located between the two side legs. Each of the two side legs 16, 21 may be terminated by a hook 29 and 26 protruding laterally outwards as depicted in FIG. 3. The housing 24 may have a slot 28, 27 in which the moveable element 18 is slidably guided. The side legs 16 and 21 may be snap-fitted in the slot and maintained in the slot by the hooks 26, 29 cooperating with an abutment 20, 17 belonging to the slot.

The magnetic field sensor 14 may be secured to the housing and positioned to face the plurality of magnetized legs 16, 19 and 21. The magnetic field sensor 14 may be coupled to a printed circuit board 15 that may be attached (not shown) to the housing 24. The magnetic field sensor 14 may detect a magnetic field generated by the plurality of magnetized legs 16, 19 and 21 as the moveable element 18 is in the engaged position 23. The moveable element 18 may be closer to the magnetic field sensor 14 in the engaged position which is depicted as a gap 23 than in the resting position. The magnetic field sensor 14 may comprise a Hall-effect or a magneto resistive sensor. The magnetic field sensor 14 may be a Hall-effect switch.

There may more than one magnetic sensor secured to the housing to provide redundancy in sensing of the magnetic field generated by the plurality of magnetized legs 16, 19 and 21 as the moveable element 18 is in the engaged position 23. For instance, an additional magnetic sensor 31 may be coupled to the same printed circuit board 15. The printed circuit board 15 may be a single or a double-sided printed circuit board 15 and the magnetic sensor 15 may be soldered to a one side of the printed circuit board 15. The additional magnetic sensor 32 may be advantageously coupled to the opposite side of the printed circuit board 15 than a first magnetic sensor 14. The both magnetic sensors 14, 32 may be placed at substantially same location having only the printed circuit board in between so that they both detect a magnetic field generated by the plurality of magnetized legs 16, 19 and 21 as the moveable element 18 moves to the engaged position 23. The both magnetic sensors may comprised of identical sensors or they may be comprised of different types of sensors for instance a Hall effect and a magneto resistive sensor.

The printed circuit board 15 may bear other electronic components 13 such as without limitation processing and or protecting circuitry, communication and/or connecting circuitry and so forth.

The moveable element 18 may be elastically biased towards the resting position via a resilient element 22 that may be positioned at least partially between the plurality of magnetized legs 16, 19 and 21 and the magnetic field sensor 7. The resilient element 22 may counteract a movement of the moveable element from the resting position to the engaged position. The resilient element 22 as depicted in FIGS. 2 and 3 may be a compression type coil spring. However, other types of resilient elements may be used. A non-limiting example of such resilient element may be an elastomer having variety of shapes, leaf spring, volute spring, extension spring and so forth.

The moveable element 18 may be made from a ferromagnetic material. The ferromagnetic material may be a metal. The metal may be a semi-hard or hard ferromagnetic metal. The metal may be made from a cobalt based metal. The moveable element 18 may be initially not magnetized. The semi-hard or hard ferromagnetic metal may be selected from materials having a coercivity Hc e.g. between 25 to 700 A/m. The ferromagnetic material may be in the shape of a metal sheet or metal plate. The ferromagnetic material may be ductile and suitable for pro-ducing the moveable element by a stamping or punching from the metal sheet or the metal plate. One benefit of such type of production is a low-cost production of the moveable element. Another benefit of such production is that the moveable element when punched from not magnetized metal sheet which simplifies its transport and handling. In general, ductile relates to a material property expressing a capacity to sustain and/or withstand plastic deformation.

Figure 7:
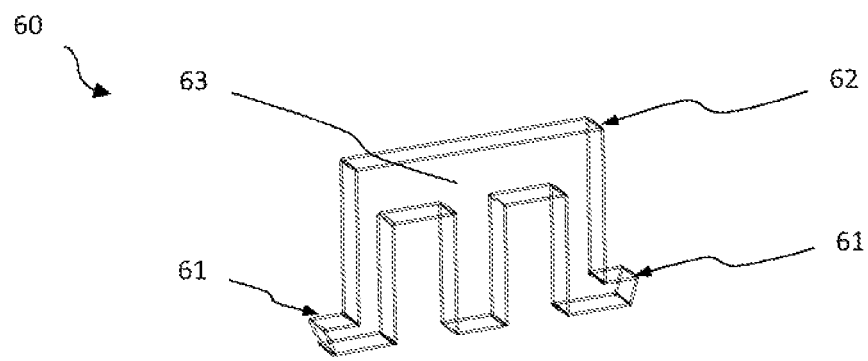
FIG. 7 is an exemplary perspective view of the moveable element.

When made of the metal sheet or the metal plate the moveable element 18 may form a plate shape with a thickness comprised between of 1 mm to 3 mm as depicted in FIG. 7 that shows an exemplary perspective view of such a plate shape 63 moveable element 62. Stamping or punching method enables a production of features such as for instance protrusions 61 termi-nating legs of the moveable element 62. The moveable element may also be made by an alternative method for instance from powder pressed metal via for instance metal injection molding or other methods involving different types of metal additive or metal subtractive manufacturing.

Once the moveable element 18 is shaped a heat treatment may be performed. The heat treatment may be an annealing. One benefit of annealing may be is that it makes the ferromagnetic material of the moveable element 18 harder than before annealing and in annealed state the ferromagnetic material of the moveable element 18 may exhibit well defined, robust and repeatable magnetic properties.

Figure 4:
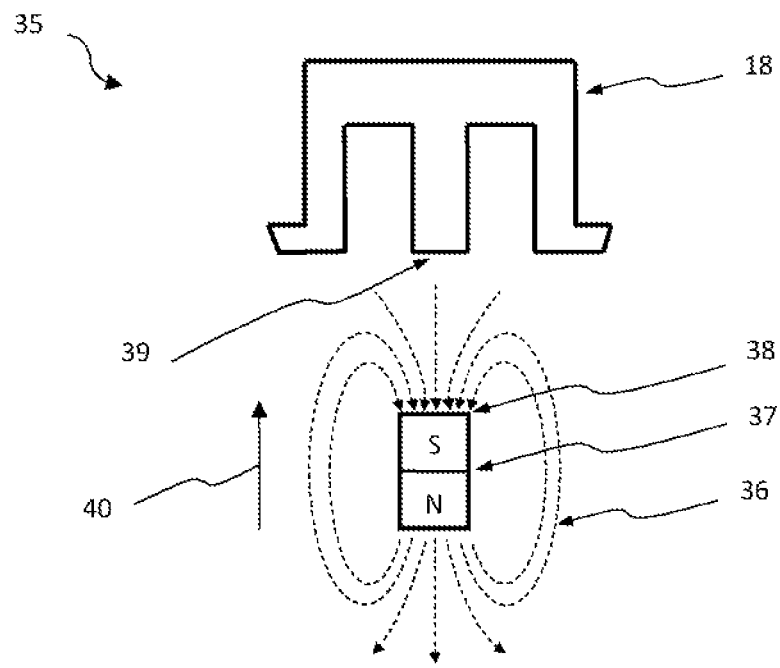
FIG. 4 is an exemplary illustration depicting the moveable element before magnetization.
Figure 5:
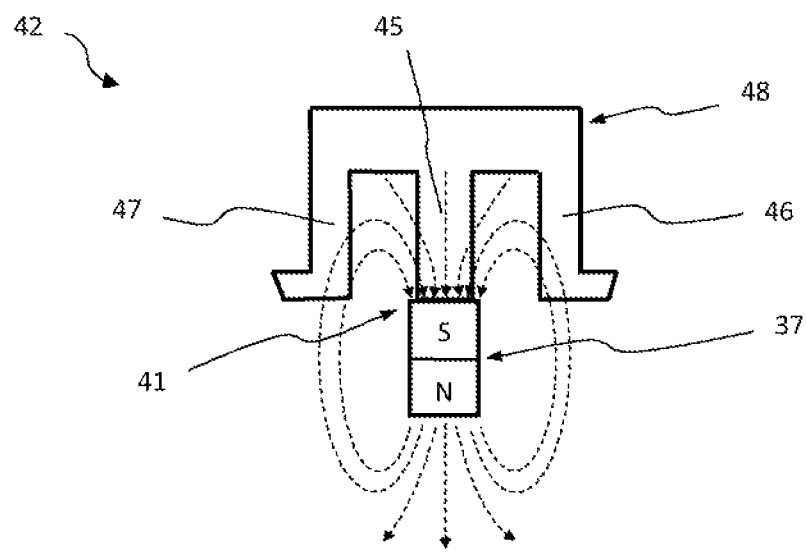
FIG. 5 is an exemplary illustration depicting the moveable element during magnetization.
Figure 8:
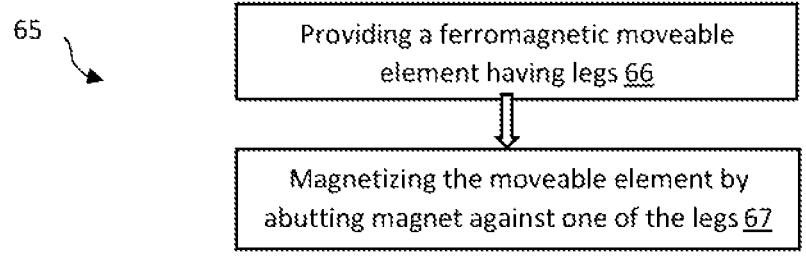
FIG. 8 is a flow diagram depicting an embodiment of a method for manufacturing a moveable element for the electrical contactless switch.

FIGS. 4, 5 and 8 depict an exemplary magnetization process of the moveable element 18 as described in either of the two embodiments. FIG. 4 depict the moveable element 18 being initially in an unmagnetized condition and a source of magnetic field 36 that may be formed by a permeant magnet 37. Alternatively, the source of magnetic field may be an electromagnet (not shown). The permanent magnet 37 may have a magnetic South pole on its first end 38 and magnetic North pole on its second end opposite to the first end 38.

The first end 38 of the permanent magnet 37 may be set to face an end 39 of the middle leg 19 of the moveable element 18. As depicted in FIG. 5 the first end 38 of the permanent magnet may be moved in the direction of arrow 40 in FIG. 4 towards the end 39 of the middle leg 45 of the moveable element 18 until the first end 38 of the permanent magnet 37 becomes abutted against the end 39 of the middle leg of the moveable element 45. The moveable element 48 consequently may become magnetized by the permanent magnet magnetic field 36 generated by the permanent magnet 37. One benefit of such magnetizing operation is in its simplicity and ability to be turned into an automatic industrial process.

The magnetizing of the legs may be performed by abutting 67 the magnet against the middle leg only. Then the magnetic lines may travel through the side legs 46, 47 of the moveable element 48 and close the magnetic circuit through the middle leg 45 of the moveable element 48. Hence, the middle leg 45 of the magnetized moveable element 48 may become magnetized in an opposite direction than the side legs 46, 47 of the magnetized moveable element 48. Provided the first end 38 of the permanent magnet bears a South magnetic pole as depicted in FIGS. 4 and 5 then the middle leg 45 of the magnetized moveable element 48 may become magnetized as a North magnetic pole and the side legs as having a South magnetic pole.

Figure 6:
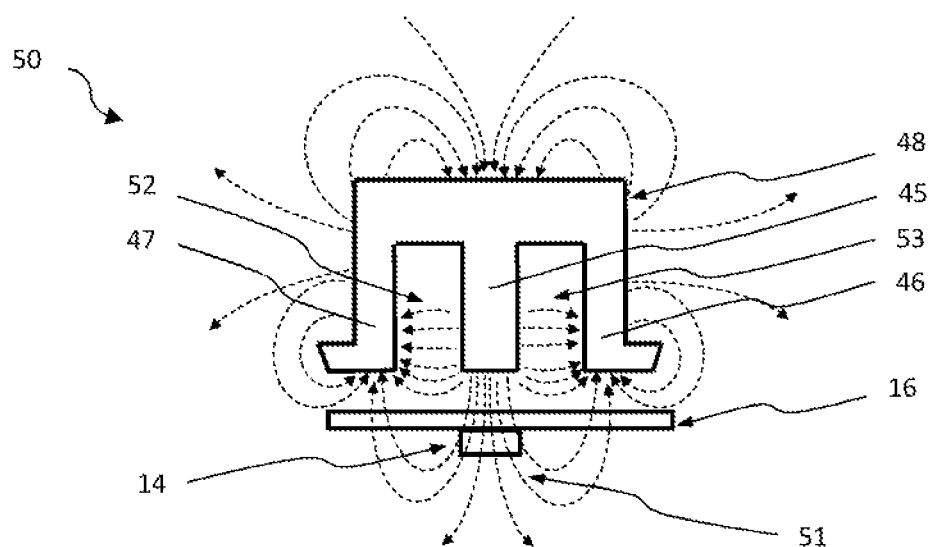
FIG. 6 is an exemplary illustration depicting a magnetized moveable element in proximity of the magnetic field sensor.

FIG. 6 depicts magnetic field lines that may be produced when the moveable element 48 is magnetized, as described above, by abutting 67 the permanent magnet 37 against the middle leg 45 of the moveable element 48 only. The magnetic field lines 51 may then flow from the middle leg 45 of the magnetized moveable element 48 to the side legs 46 and 47. The magnetic force lines flowing through the gaps 52, 53 between the middle leg 45 and each of the side legs 46, 47 of the moveable element 48 may be denser than the magnetic field lines 51 that close between middle leg 45 and each of the side leg 46, 47 through the magnetic field sensor 14.

One benefit of such flat and focused shape of the movable element 48 is that it enables to design a compact size yet robust electrical contactless switch.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

The invention claimed is:

1. An electrical contactless switch comprising:
   a housing;
   a resilient element;
   a moveable element made of a ferromagnetic material and slidably mounted in the housing, the moveable element is adapted to move relative to the housing between a resting position and an engaged position, the moveable element being elastically biased towards the resting position, wherein the moveable element comprises a plurality of magnetized legs spaced from each other and at least part of the magnetized legs is slidably guided in the housing; and
   a magnetic field sensor secured to the housing and positioned to face the plurality of magnetized legs, the magnetic sensor is configured to detect a magnetic field generated by the magnetized legs as the moveable element is in the engaged position, wherein the moveable element is closer to the magnetic field sensor in the engaged position than in the resting position, wherein the resilient element is positioned at least partially between the plurality of magnetized legs and the magnetic field sensor, wherein the resilient element is configured to elastically bias the moveable element towards the resting position and counteract a movement of the moveable element from the resting position to the engaged position.

2. The electrical contactless switch according to claim 1, wherein the legs of the plurality of magnetized legs protrude in parallel from one side of the moveable element.

3. The electrical contactless switch according to claim 2, wherein the plurality of magnetized legs comprises two side legs and a middle leg between the two side legs, wherein the middle leg is magnetized in an opposite direction than the two side legs.

4. The electrical contactless switch according to claim 3, wherein each of the two side legs is terminated by a hook protruding laterally outwards.

5. The electrical contactless switch according to claim 4, wherein the housing comprises a slot in which the moveable element is slidably guided and the side legs are snap-fitted in the slot and maintained in the slot by the hooks cooperating with an abutment belonging to the slot.

6. The electrical contactless switch according to claim 1, wherein the plurality of magnetized legs is magnetized such that at least one leg of the plurality of magnetized legs is magnetized in an opposite direction than the rest of the plurality of magnetized legs.

7. The electrical contactless switch according to claim 1, wherein the resilient element is a compression type coil spring.

8. The electrical contactless switch according to claim 1, wherein the moveable element is made of an annealed semi-hard ferromagnetic metal or a hard ferromagnetic metal.

9. The electrical contactless switch of claim 8, wherein the annealed ferromagnetic metal is a cobalt based metal.

10. The electrical contactless switch according to claim 1, wherein the magnetic field sensor comprises a Hall-effect or a magneto resistive sensor.

11. The electrical contactless switch according to claim 10, wherein the magnetic field sensor is a Hall-effect switch.

12. A method for manufacturing a moveable element for the electrical contactless switch according to claim 1, the method comprising:

providing the moveable element made of a ferromagnetic material and comprising a plurality of legs spaced from each other; and magnetizing the moveable element by abutting a magnet against one of the legs.

13. The method for manufacturing a moveable element according to claim 12, wherein the plurality of magnetized legs comprises two side legs and a middle leg between the two side legs and magnetizing the legs is performed by abutting the magnet against the middle leg only.

14. The method for manufacturing a moveable element according to claim 13, wherein the magnet is a permanent magnet and the moveable element is made of an annealed semi-hard ferromagnetic metal or hard ferromagnetic metal.

15. The electrical contactless switch according to claim 1, wherein the moveable element has a plate shape.

16. The electrical contactless switch according to claim 15, wherein the plate shape of the moveable element has a thickness of 1 mm to 3 mm.

17. The electrical contactless switch according to claim 16, wherein the moveable element is made of a semi-hard or a hard ferromagnetic material.

* * * * *